United States Patent [19]

Davis

[11] Patent Number: 4,789,646
[45] Date of Patent: Dec. 6, 1988

[54] METHOD FOR SELECTIVE SURFACE TREATMENT OF SEMICONDUCTOR STRUCTURES

[75] Inventor: Mark A. Davis, Linden, Utah

[73] Assignee: North American Philips Corporation, Signetics Division Company, Sunnyvale, Calif.

[21] Appl. No.: 75,365

[22] Filed: Jul. 20, 1987

[51] Int. Cl.$^4$ ............... H01L 21/38; H01L 21/47
[52] U.S. Cl. ............................ 437/141; 437/225; 437/229; 156/662; 430/84; 430/270
[58] Field of Search ............... 437/229, 225, 141; 156/662, 974; 430/270, 84

[56] References Cited

U.S. PATENT DOCUMENTS

| | | | |
|---|---|---|---|
| 3,718,514 | 2/1973 | Erdman et al. | 437/81 X |
| 4,025,411 | 5/1977 | Hom-Ma et al. | 148/DIG. 20 |
| 4,510,173 | 4/1985 | Higashikawa et al. | 357/52 X |
| 4,532,002 | 7/1985 | White | 437/229 X |
| 4,539,222 | 9/1985 | Anderson, Jr. et al. | 437/229 X |
| 4,545,852 | 10/1985 | Barton | 437/229 X |
| 4,612,701 | 9/1986 | Cox | 437/225 X |
| 4,621,042 | 11/1986 | Pampalone et al. | 437/229 X |
| 4,634,496 | 1/1987 | Mase et al. | 437/229 X |
| 4,655,874 | 4/1987 | Marks | 437/229 X |

*Primary Examiner*—George T. Ozaki
*Attorney, Agent, or Firm*—John C. Fox

[57] ABSTRACT

Surface features of a semiconductor structure above a predetermined level are exposed for selective treatment (e.g., etching) by forming a layer of a solvent-expanded polymer on the surface of the structure, and allowing the layer to dry and cure, thereby relaxing to the predetermined level, at which it protects the underlying structure during treatment. Subsequently, the protective layer is removed by rinsing in a solvent.

21 Claims, 7 Drawing Sheets

METHOD FOR SELECTIVE SURFACE TREATMENT OF SEMICONDUCTOR STRUCTURES

BACKGROUND OF THE INVENTION

This invention relates to the processing of semiconductor devices and circuits, and more particularly relates to a method for selectively treating surface features of a semiconductor structure above a predetermined vertical level.

As the semiconductor devices in integrated circuits become smaller and more closely packed, the upper layers of the devices, such as the metal interconnect patterns, must accommodate more abrupt changes in surface topography caused by the smaller lateral dimensions of the devices. Deviations from planarity, sometimes called "steps", make accurate micropatterning of the surface configuration difficult. In extreme cases, steps cannot be covered completely, so that discontinuities occur in the overlying metal layer. The problem is accentuated as more layers are added, such as in the case of interconnected multi-level integrated circuits, creating more complicated surface topographies having more and larger steps.

Etching techniques are known which will "planarize" a non-planar surface. For example, U.S. Pat. No. 4,025,411 describes a process in which the non-planar surface of a semiconductor device is made planar by first applying a layer of liquid photoresist over the uneven surface, then allowing the photoresist to solidify, and finally etching the surface by a physical etching method (for example, RF sputter etching or ion milling) which removes the photoresist and the underlying material at about the same rate. Another planarization technique involving physical etching is described in U.S. Pat. No. 4,510,173.

However, such physical etching techniques require the use of sophisticated equipment, which must be carefully controlled in order to achieve satisfactory results.

Chemical methods of planarization are also known. For example, U.S. Pat. No. 3,718,514, issued Feb. 17, 1973, describes a method for removing projections (having a height of from less than one to about fifty microns) from epitaxial layers such as silicon, the method comprising first forming an oxide layer on the surface, and then forming an etch-resistant film on the oxide layer, in a manner to form pin holes in the film. These pin holes have a high probability of occuring at the sites of the projections. The portions of the oxide layer thus exposed by the pin holes are removed by chemical etching, after which the film is stripped from the oxide layer. The projections exposed by the oxide etch are then removed by a chemical etchant selective for silicon. Due to the random nature in which the projections are exposed for etching, the above steps are preferably repeated one or more times in order to increase the effectiveness of the process.

An improvement to the above process is described in German Offenlegungsschrift No. 2431467, laid open Jan. 22, 1976, in which the surface of an epitaxial layer is coated directly with a film of an etch-resistant material. Typical etch-resistant materials said to be suitable for the practice of the invention include the photosensitive resists conventionally used in semicondcutor processing as well as suitable carbon derivatives such as picein. The film completely covers the smallest projections, while only covering the sides of the larger projections. The surface of the film is markedly uneven. Then, while the epitaxial surface is in a horizontal orientation, the film is heated to near the yield point of the material (for example, 50° C. to 250° C.) in order to allow it to flow, thereby planarizing the surface, sealing pin holes and liberating the projections from the coating.

In this condition, the layer has receded from the sides of the larger projections (up to 100 micrometers in height) and no longer covers the smaller projections. The projections thus exposed are subsequently removed by a chemical etchant.

While this process is simpler than the multistep process of U.S. Pat. No. 3,718,514, it would nevertheless be desirable to eliminate the need for a separate heating step to fluidize the etch-resistant material in order to selectively expose the projections for etching.

Accordingly, a principal object of the invention is to provide a single step, economical process for forming a continuous, substantially planar protective layer on the surface of a semiconductor structure to be treated.

Another object of the invention is to provide such a layer which surrounds projections from the surface of the structure so that the projections may be subsequently selectively treated.

Another object of the invention is to provide control over the thickness of the protective layer so that only those projections above a predetermined vertical level of the structure may be selectively treated.

SUMMARY OF THE INVENTION

In accordance with the invention, there is provided a process for selectively treating surface features of a semiconductor structure supported on a planar substrate, the features lying above a predetermined vertical level in the structure, the method comprising:

(a) covering the surface of the structure, including the features to be treated, with a continuous layer of a solvent-expanded, relaxable, room temperature curing polymer composition, to a level above the predetermined level by an amount sufficient to result in the upper surface of the layer dropping to the predetermined level upon drying and curing of the layer;

(b) allowing the solvent-expanded layer to dry and cure, thereby decreasing in volume, causing the upper surface of the layer to drop to the predetermined level, and causing the layer to withdraw from surface features lying above the predetermined level, thus exposing the surface features for treatment;

(c) treating the exposed surface features; and (d) removing the polymer layer from the structure.

Solvent based polymer compositions suitable for use in the method of the invention are characterized by relatively small chained polymer components which are loosely crosslinked, which can be expanded by the addition of a non-polar solvent or an increase in pH, and which will relax and may, depending upon the composition and the environment, spontaneously crosslink upon evaporation of the solvent to form a cured protective layer. The compositions must also have sufficient fluidity prior to curing to spontaneously form a substantially planar upper surface, and have sufficient cohesiveness during relaxation and crosslinking to substantially overcome opposing forces of adhesion of the relatively thin portions of the layer adhering to the surface features to be treated, thereby drawing these portions into the surrounding bulk of the layer.

The term "small chained polymers" as used herein is meant to include those polymers having an average molecular weight of about 72 grams/mole to 4500 grams/mole and preferably 120 grams/mole to 1200 grams/mole.

Especially suitable polymer compositions for use in the method of the invention are solvent-soluble acrylic resin compositions, containing from about 20 to 80 volume percent of solvent, such as water soluble acrylic polymers having hydroxyl and carboxyl functional groups.

For these polymer materials, it has been found that adding additional solvent to increase the initial volume from about 1 to 10 times results in sufficient fluidity to form a continuous layer having a substantially planar surface, the fluidity in general increasing and the thickness of the deposited layer decreasing with increasing amounts of solvent. The solvent may be polar or nonpolar or a mixture of these two types, but where a nonpolar solvent is relied upon to achieve swelling of the polymer, it should be present in an amount of at least about 3 volume percent.

The expansion is thought to be necessary in order to enhance fluidity and to set up the cohesive forces required during subsequent relaxation and cross-linking to cleave the portions of the layer covering the projections and draw them into the surrounding bulk of the polymer layer, thereby exposing the projections for subsequent treatment. In order for the projections to be exposed, the thickness of the portions of the layer covering the projections must not exceed about 60% of the bulk thickness, and preferably be about 25% or less of the bulk thickness. The level of the upper surface of the solvent-expanded layer may be at or above the tops of the projections, so long as the above thickness limitations are observed. However, this surface will normally be at a lower level than the tops of the projections, in which case the solvent-expanded polymer clings to the projections without breaking the surface of the layer, by virtue of a balancing of the opposing forces of surface tension and adhesion to the surface of the projections.

The bulk thickness of the solvent-expanded layer desired will, of course, depend upon the location of the predetermined level above which treatment will take place, and upon the amount of relaxation of the layer which will occur during drying and curing. The amount of relaxation, i.e., volume reduction, will in general range from about 5 to 40 volume percent, depending upon the amount of solvent present and the amount of expansion which has taken place.

An additional consideration in arriving at a desired thickness is the effect of the subsequent treatment of the projections upon the protective layer itself. For example, where the treatment consists of etching the projections, certain etchants may attack and partially consume the layer during removal of the projections, depending upon the degree of resistance of the dried and cured layer. This could be advantageous in situations where progressive exposure and treatment of the projections is desired.

The bulk thickness of the solvent-expanded layer actually obtained will depend upon its flow characteristics, which in turn are dependent upon the amount of solvent dilution and the amount of expansion, as well as upon the original flow characteristics of the undiluted polymer composition. In general, the more fluidity the composition possesses, the thinner the layer which will be obtained. Subjecting the solvent-expanded composition to sheer forces, such as the centrifugal force due to spinning of a substrate coated with the composition will enhance the flow as well as the planarization of the surface of the resultant layer.

DESCRIPTION OF THE DRAWINGS

The invention will now be described in terms of a limited number of preferred embodiments in connection with the drawings in which.

DESCRIPTION OF THE PREFERRED EMBODIMENTS

Figure 1:
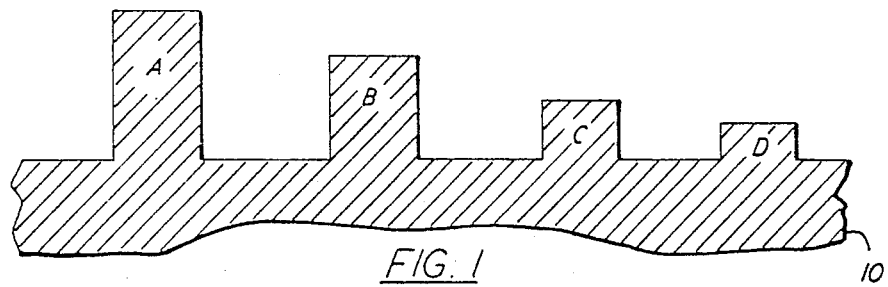
FIGS. 1 through 4 are sectioned elevation views showing the sequential steps involved in the formation of a protective layer on a semiconductor structure in accordance with the method of the invention.
Figure 2:
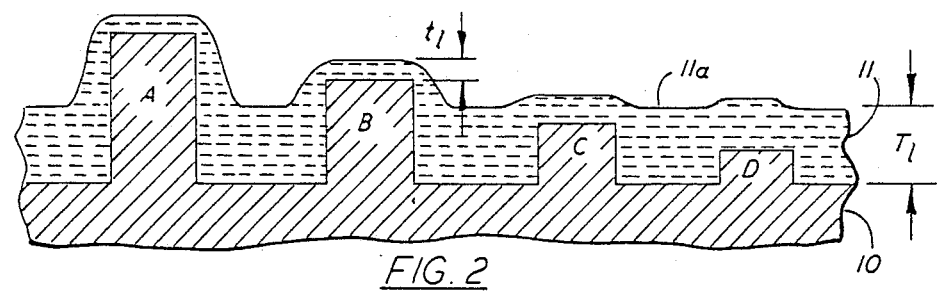

Referring now to FIG. 1, there is shown a substrate of single crystal silicon 10 having vertical structures of various heights indicated by the letters A, B, C and D. These vertical structures may be unwanted projections from an epitaxial layer surface, vertical transistors, or other structures. In accordance with the method of the invention, projections A and B have been selected for treatment. Accordingly, the surface of substrate 10, including all of the projections A through D, is covered with a solvent-expanded polymer composition 11 in an amount to result in a bulk thickness $T_1$ which is small enough after drying and curing of the layer to expose projections A and B, but large enough to form a protective covering over projections C and D. For this purpose, the thickness of the layer $t_1$ over the tops of projections A and B should not exceed about 60% of the bulk thickness $T_1$ and preferably not exceed about 25% of the bulk thickness $T_1$. For those situations in which the upper surface 11a of layer 11 is below the tops of projections A and B such as in FIG. 2, the cohesive forces of the layer, including the surface tension of the layer, will in general insure that the thickness $t_1$ will fall within the above limits.

Figure 3:
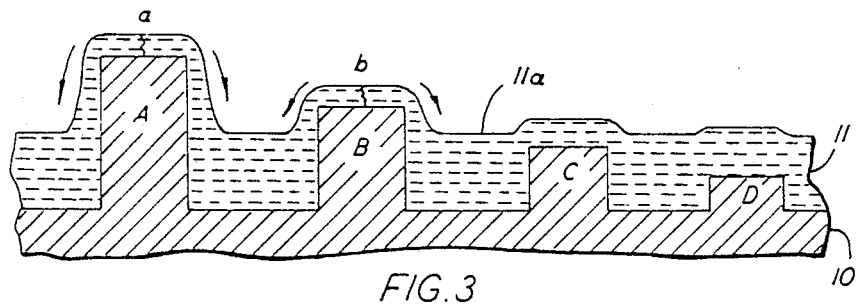
Figure 4:
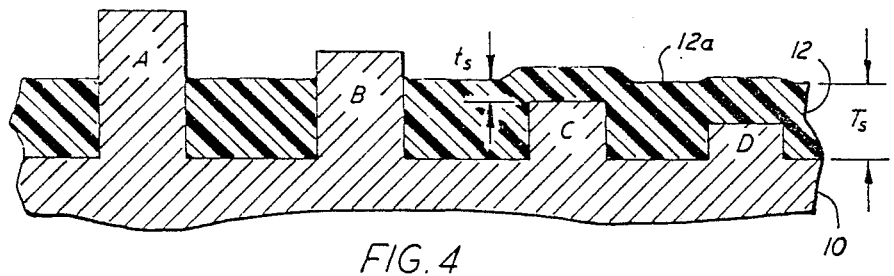

Referring now to FIG. 3, as layer 11 begins to dry and relax through loss of solvent, these cohesive forces will overcome the adhesive forces between the layer portions above surface 11a and the portions of projections A and B above surface 11a, resulting in cleavage of the layer over the projections A and B at points a and b respectively, and withdrawal of these portions into the bulk of layer 11, as indicated by the arrows. FIG. 4 shows the dried and cured state of the layer, now designated 12, having a bulk thickness $T_s$ and a surface 12a at a predetermined vertical level in the structure above which treatment of projections A and B will take place. The thickness $t_s$ of the dried and cured layer covering projection C should, of course, be sufficient to protect projection C from subsequent treatment, while the bulk thickness $T_s$ of the dried and cured layer 12 should result in the desired vertical placement of surface 12a.

By way of example, typical bulk thicknesses $T_s$ can range from about 800 to about 5,000 angstroms, corresponding to thicknesses $T_1$ prior to drying and curing in the range of from about 840 to about 8,500 angstroms. $t_s$ should in general be at least about 400 angstroms.

Figure 5:
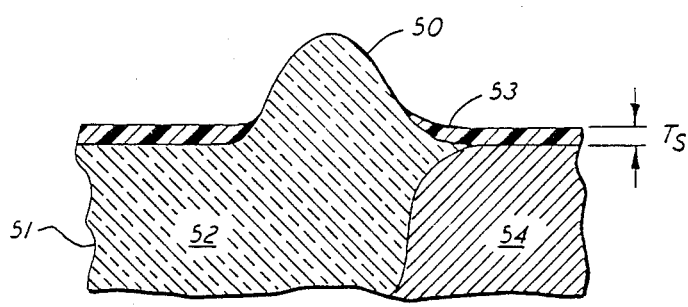
FIGS. 5 through 7 are sectioned elevation views showing the sequential steps involved in the removal of a bird's beak projection from the surface of a semiconductor structure in accordance with the method of the invention.
Figure 6:
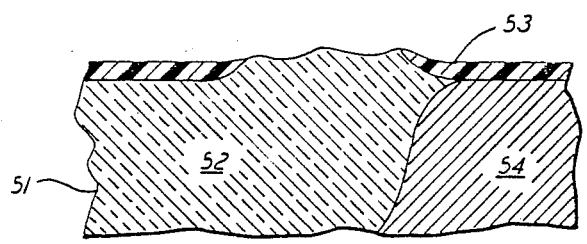
Figure 7:
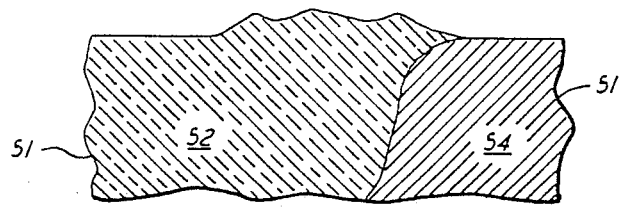
Figure 8:
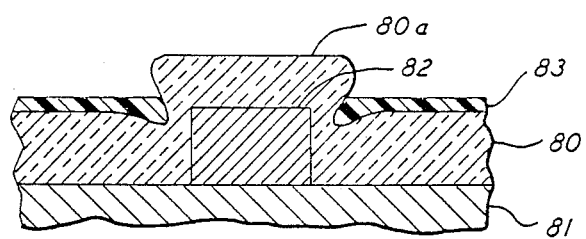
FIGS. 8 through 11 are sectioned elevation views showing the sequential steps involved in the planarization of a glass layer in a semiconductor structure in accordance with the method of the invention.
Figure 9:
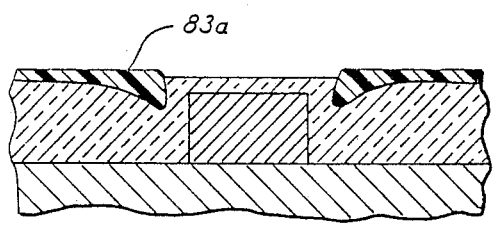
Figure 10:
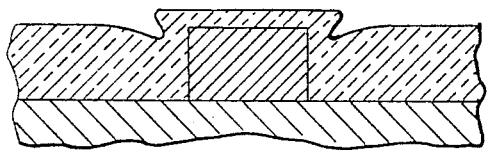

FIGS. 5 through 7 illustrate an application of the method of the invention in which the surface of a semiconductor structure is planarized by removal of so-called "bird's heads", artifacts of the formation of thick isolating oxide layers by the local oxidation of silicon. FIG. 5 shows such a bird's head 50 which rises above the surface of a semiconductor device 51 as an extension of field oxide region 52, by as much as about 4,500 angstroms. Bird's heads disrupt the planarity of the device and interfere with subsequent metallization of the device.

Protective layer 53, preferably having a bulk thickness $T_s$ much smaller than the height of the bird's head, is formed in the manner previously described. The exposed bird's head 50 is then substantially completely removed by chemical etching to result in a structure as shown in FIG. 6. Any of the well known chemical etchants for silicon oxide may be used, such as, for example, hydrofluoric acid, often buffered with ammonium fluoride, in which form it is commonly referred to as buffered oxide etch or "BOE" aqueous hydrofluoric acid solution, or buffered hydrofluoric acid solution. Following etching, the protective layer 53 is then stripped away, for example, by rinsing the treated structure in the appropriate solvent for the layer 53, which may be either polar or non-polar, depending upon the nature of the polymer composition. For the preferred water-based acrylic resin compositions, a water rinse or rinsing alternately in water and a non-polar solvent such as xylene may be employed.

Using the method of the invention, the height of such bird's heads have been reduced from over 4,500 angstroms to less than 400 angstroms.

Where both the resin and the etchant are diluted with polar solvents, or both with non-polar solvents, it is preferred to dilute either the resin or the etchant with a different miscible solvent. For example, where the resin is a water based acrylic polymer, and the etchant is hydrofluoric acid or BOE, it is preferred to dilute the etchant with alcohol. Particularly preferred for this purpose are solutions of hydrofluoric acid in isopropyl alcohol in the ratio of about 1:2 to 1:4 parts by volume, and BOE in methanol in the ratio of about 2:1 to 1:2 parts by volume. Such etching solutions have been found to result in substantial reduction of the bird's heads, for example, 1,000 angstroms or more, without significant undercutting of the resin layer adjacent the bird's head. In addition to alcohols, the etchants could be diluted with other non-polar solvents, such as glycols and glycol ethers. In the alternative, the water-based acrylic polymer composition could be diluted with a non-polar solvent, or a surface modifier such as hexamethyldisilicate ("HMDS") could be added to the polymer in order to reduce its wettability by the etchant.

Within the broad limits already described above, the thickness of the protective layer 53 should, of course, be sufficient to provide adequate protection of the underlying field oxide 52 and adjacent silicon mesa 54. However, it will be realized that the speed with which the bird's head 50 is reduced will be greater for smaller resin thicknesses, since more of the bird's head surface will be exposed to attack by the etchant, laterally as well as vertically.

The layer thickness may be controlled by a number of factors including: polymer formulation and percent solids (both of which affect viscosity); the addition of swelling agents; the application procedure; and the drying procedure. However, the most convenient way to vary the thickness is to vary the amount of solvent dilution of the resin. For example, for the water based acrylic resin already referred to, the thickness of the layer may be varied within the range of from about 900 to 1,500 angstroms by varying the volume ratio of polymer to solvent within the range of about 4:1 to 1:2, with greater dilutions corresponding to lower thicknesses. These water-based acrylic polymers are commercially available. Particularly suitable are water soluble acrylic resins marketed by Rohm and Haas of Philadelphia, Pa., under the tradenames Acrysol WS-32 and Acrysol WS-50. A xylene-soluble acrylic polymer which has also been found suitable for use in the method of the invention is marketed by the same company under the tradename Acryloid AT-51.

While it is unnecessary for the successful practice of the method of the invention, it may be advantageous to subject the protective polymer layer to a moderately elevated temperature during drying and curing, for example, up to 200° C., in order to accelerate drying and curing. In addition, such heating may enhance adhesion of the polymer layer to the substrate. This greater adhesion may require more extensive rinsing to effect substantially complete removal of the layer from the substrate after treatment. In such instances, alternate rinsing with different solvent types, e.g., water and alcohol, has been found to be more effective in removing such layers than a single rinse in one solvent.

In an exemplary procedure for forming the protective polymer layer, the water-soluble acrylic resin composition WS-50 is diluted with water to increase its initial volume one and one-half times and then diluted with methanol to increase its initial volume seven times, in order to cause expansion and increased fluidity of the polymer composition. Addition of the methanol also has the effect of increasing the resistance of the composition to shearing caused, for example, by the centrifugal force generated during spinning of the polymer composition onto a substrate. Such increased resistance has been found to result in better flow properties and thickness uniformity of the film.

2 milliliters of the diluted and expanded composition is placed dropwise onto a 3 inch silicon wafer. The wafer is then spun for 10 seconds at 2,500 revolutions per minute and for 15 seconds at 4,500 revolutions per minute. The thus-coated wafer may be optionally subjected to a bake at a moderate temperature of about 100° C. to 200° C.

Following removal of the bird's heads by etching, the protective layer 53 is then removed to result in the planarized structure shown in FIG. 7. Protective layer 53 may be removed simply by rinsing in a bath of one or more of the same solvents present in the diluted polymer composition. For the water based acrylate compositions, it has been found that alternately rinsing in water and alcohol can remove the layer 53 more rapidly and completely than a single rinse in one of these solvents.

After rinsing, the surface is dried, for example, by spinning the substrate to remove the liquid by a combination of evaporation and centrifugal force.

Figure 11:
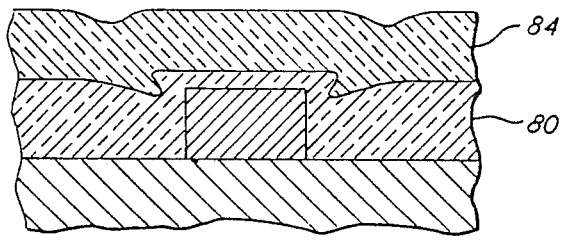

Referring now to FIGS. 8 through 11, there is shown another embodiment of the method of the invention in which a thick layer of "glass" (chemically deposited polycrystalline silicon) 80, covering the surface of silicon substrate 81 and metal step 82 located on the substrate, is planarized. As known, the sharp corners of metal step 82 are responsible for the cusping 80a of the glass layer in the vicinity of these corners. In accordance with the method of the invention, glass layer 80 is planarized by first forming protective polymer layer 83 in the manner already described, and then etching the portion 80a of glass layer 80 which projects above the top surface 83a of protective layer 83, to result in the planarized structure shown in FIG. 9. Layer 83 is then removed by solvent rinsing to result in the structure shown in FIG. 10, and a second glass layer 84 is then deposited over the first glass layer 80 to form the final structure as shown in FIG. 11.

Figure 12:
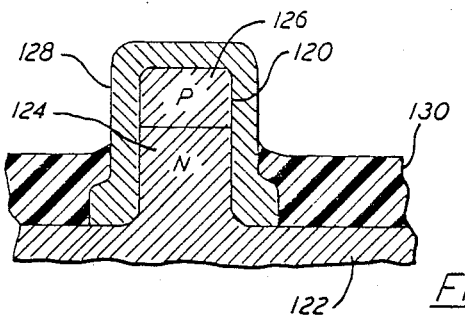
FIGS. 12 through 15 are sectioned elevation views showing the sequential steps involved in the selective removal of metal from a vertical transistor in a semiconductor structure in accordance with the method of the invention.
Figure 13:
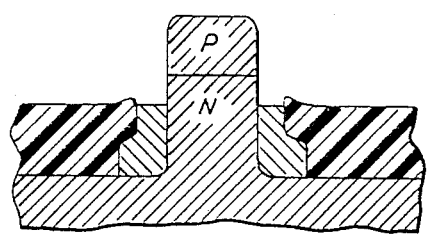
Figure 14:
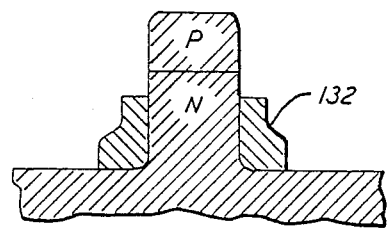
Figure 15:
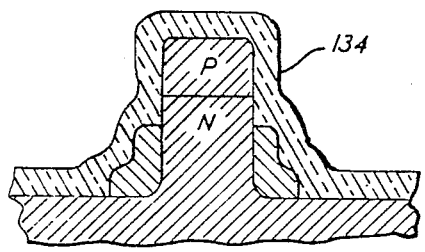

Referring now to FIGS. 12 through 15, there is shown another embodiment of the invention in which vertical metal leads are defined on a vertical transistor. As seen in FIG. 12, the transistor is defined by a projection 120 which rises above the surface of doped silicon substrate 122 and contains regions 124 and 126 doped with n type and p type impurities, respectively. Covering this projection is metal layer 128. Protective polymer layer 130, having been formed as described above, protects the portion of metal layer 128 adjacent the n-doped region of the device. The exposed portion of metal layer 128 is then removed by etching to result in the structure shown in FIG. 13, after which the protective polymer layer 130 is removed by rinsing to result in the structure shown in FIG. 14. Subsequently, a protective glass layer 134 is deposited over the vertical transistor 120 and vertical metal leads 132.

Figure 16:
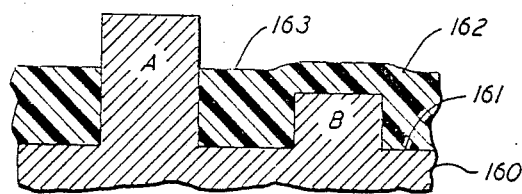
FIGS. 16 through 19 are sectioned elevation views showing the sequential steps involved in the selective addition of material to a surface feature of a semiconductor structure in accordance with the method of the invention.
Figure 17:
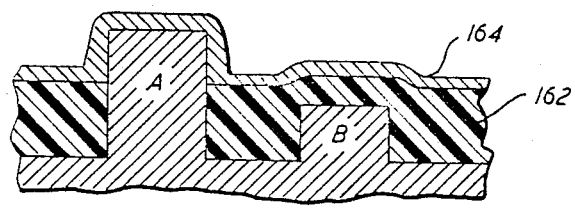
Figure 18:
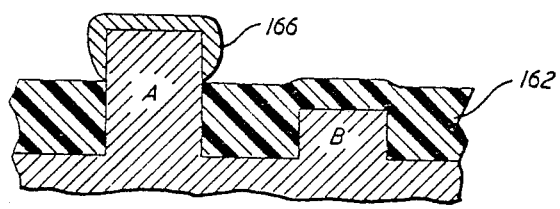
Figure 19:
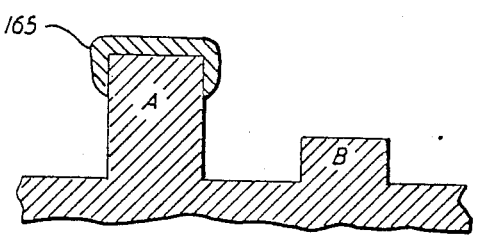

FIGS. 16 through 19 show still another embodiment of the invention in which silicon substrate 160 has two vertical projections A and B rising above the substrate surface 161, as shown in FIG. 16. In order to selectively deposit material on the upper portion of projection A, a protective layer 162 has been formed having upper surface 163 above the upper surface of projection B but below the upper surface portion of projection A. Selective deposition of material on the exposed portion of projection A may then be accomplished in either of two ways. A layer of material 164 such as metal may be deposited over the entire surface of the structure as shown in FIG. 17, followed by stripping away protective layer 162 to result in the structure shown in FIG. 19. Alternatively, a layer of a material 166, such as a refractory metal tungstate, may be selectrvely deposited on the exposed silicon surface as shown in FIG. 18, and protective layer 162 then removed to result in the structure shown in FIG. 19.

Figure 20:
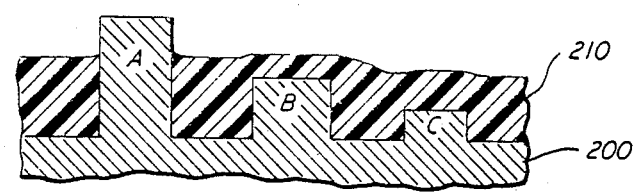
FIGS. 20 through 24 are sectioned elevation views showing sequential steps involved in the planarization and selective addition of material to surface features of a semiconductor structure in accordance with the method of the invention.
Figure 21:
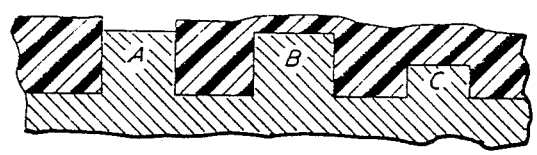
Figure 22:
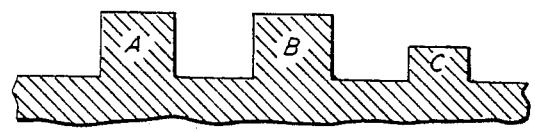
Figure 23:
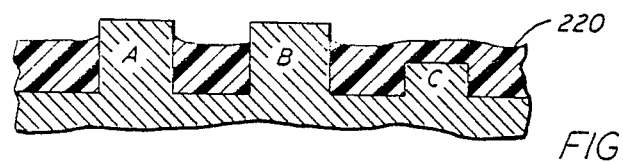
Figure 24:
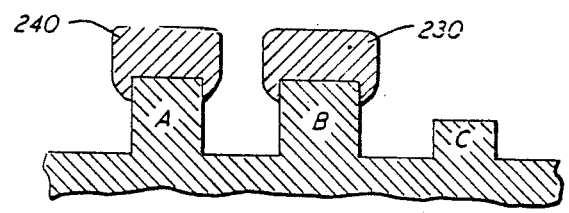

FIGS. 20 through 24 show a variation of the previous embodiment in which prior to deposition of additional material on projections A and B of silicon substrate 200, projection A is first planarized with respect to projection B by the formation of protective layer 210 as shown in FIG. 20, followed by etching of projection A to result in the structure shown in FIG. 21. Protective layer 210 is then removed as shown in FIG. 22, and a new protective layer 220 is formed above the surface of projection C but below the upper portions of projections A and B, to result in the structure shown in FIG. 23. Finally, additional material 230 and 240 is deposited on projections A and B, for example, as described in connection with FIGS. 16 through 19.

Figure 25:
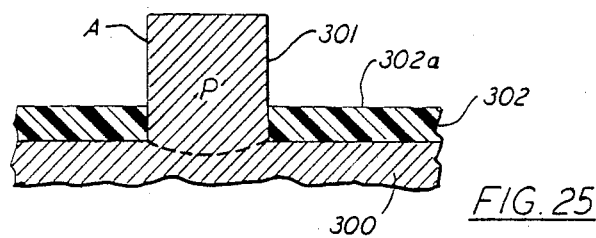
FIGS. 25 through 29 are sectioned elevation views showing sequential steps involved in the formation of a vertical transistor in accordance with the method of the invention.
Figure 26:
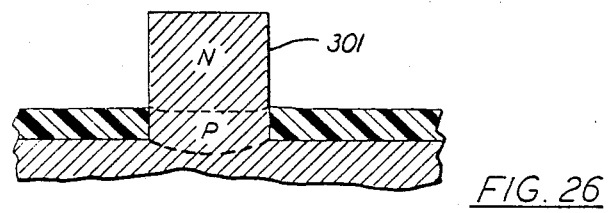
Figure 27:
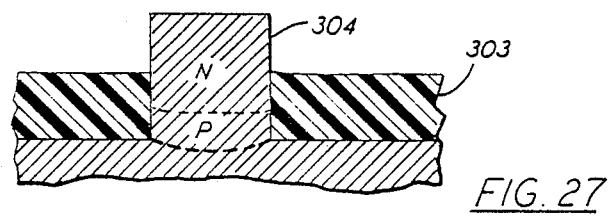
Figure 28:
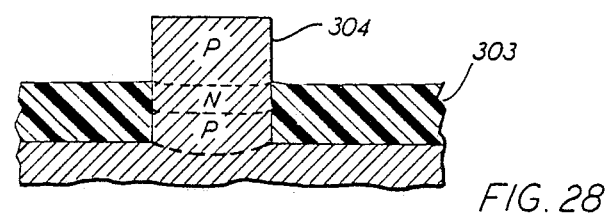
Figure 29:
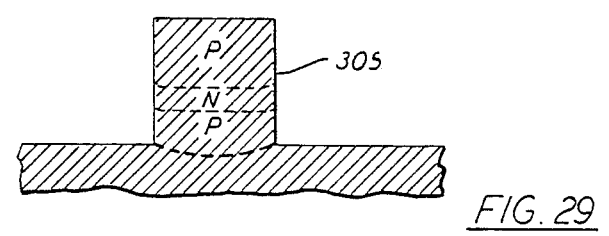

FIGS. 25 through 29 illustrate still another embodiment of the invention in which a vertical transistor is formed. FIG. 25 shows projection A from silicon substrate 300 having an exposed upper portion 301 extending above the upper surface 302a of protective polymer layer 302. Projection A has been previously doped, such as by solid state diffusion or ion implantation, with p-type impurities. Exposed portion 301 is then doped n-type, as shown in FIG. 26. Protective layer 302 is then replaced by a thicker protective layer 303 to expose a smaller portion 304 of projection A to doping, as shown in FIG. 27. This exposed portion 304 is then doped p-type, as shown in FIG. 28. In FIG. 29, protective layer 303 has been removed to result in a vertical pnp transistor 305.

The invention has been described in terms of a limited number of preferred embodiments. Other embodiments and variations will become readily apparent to those skilled in the art and are intended to be encompassed within the scope of the appended claims.

What is claimed is:

1. A method for the selective treatment of surface features of a semiconductor structure on a planar substrate, the features lying above a predetermined vertical level in the structure, the method comprising:
    (a) covering the surface of the structure, including the features to be treated, with a continuous layer of a solvent-expanded, relaxable, room temperature curing polymer composition, to a level above the predetermined level by an amount sufficient to result in the upper surface of the layer dropping to the predetermined level upon drying and curing of the layer;
    (b) allowing the solvent-expanded layer to dry and cure, thereby relaxing and decreasing in volume, causing the upper surface of the layer to drop to the predetermined level, and causing the layer to withdraw from surface features lying above the predetermined level, thus exposing the surface features for treatment;
    (c) treating the exposed surface features; and
    (d) removing the polymer layer from the structure.

2. The method of claim 1 in which the polymer composition is characterized by small chained polymer components which are loosely crosslinked, which can be swollen by the addition of a non-polar solvent or an increase in pH and which will relax upon loss of the solvent to form a cured protective layer.

3. The method of claim 2 in which the polymer compositon has an average molecular weight of about 72 to 4500 grams per mole.

4. The method of claim 3 in which the polymer composition has an average molecular weight of from 120 to 1200 grams per mole.

5. The method of claim 1 in which the polymer composition is selected from the group consisting of water-soluble acrylic resin compositions and alcohol-soluble acrylic resin compositions having both hydroxyl and carboxyl functional groups.

6. The method of claim 5 in which the solvent-expanded polymer composition has a volume of about 1 to 10 times the initial volume of the polymer composition.

7. The method of claim 6 in which the solvent is a mixture of water and at least one non-polar solvent.

8. The method of claim 7 in which the non-polar solvent is present in the amount of at least 3 percent by volume of the total solvent.

9. The method of claim 1 in which the thickness of the solvent-expanded layer covering the projections to be treated is up to about sixty percent of the thickness of the layer surrounding the projections to be treated.

10. The method of the claim 9 in which the thickness of the solvent-expanded layer covering the projections to be treated is up to about 25 percent of the thickness of the layer surrounding the projections to be treated.

11. The method of claim 1 in which the solvent-expanded layer decreases in volume in the amount of from about 5 to 40 volume percent during drying and curing.

12. The method of claim 1 in which the predetermined level is at least 400 angstroms above the tops of surface features to be protected.

13. The method of claim 1 in which the substrate is silicon.

14. The method of claim 13 in which the surface features to be treated are silicon dioxide.

15. The method of claim 14 in which the surface features to be treated are removed by chemical etching.

16. The method of claim 15 in which the chemical etchant is selected from the group consisting of hydrofluoric acid, aqueous hydrofluoric acid solution and buffered hydrofluoric acid solution.

17. The method of claim 13 in which the surface features to be treated are silicon.

18. The method of claim 17 in which the surface features to be treated are doped with impurities.

19. The method of claim 18 in which the impurities are both n-type and p-type and are doped at different levels to form one or more pn junctions.

20. The method of claim 1 in which etching is followed by depositing at least one layer of a material on the etched surface.

21. The method of claim 20 in which the material is selected from the group consisting of silicon and refractory metal tungstates.

* * * * *